United States Patent [19]

Alley et al.

[11] Patent Number: 5,232,145

[45] Date of Patent: Aug. 3, 1993

[54] METHOD OF SOLDERING IN A CONTROLLED-CONVECTION SURFACE-MOUNT REFLOW FURNACE

[75] Inventors: Richard C. Alley, Santa Cruz; Stephen E. Carmassi, Scotts Valley; William T. Daley, Aptos; Michael F. Roffey, Scotts Valley, all of Calif.

[73] Assignee: Watkins-Johnson Company, Palo Alto, Calif.

[21] Appl. No.: 677,661

[22] Filed: Mar. 29, 1991

[51] Int. Cl.$^5$ ............... B23K 1/012; B23K 31/02; H05K 3/34
[52] U.S. Cl. .................... 228/102; 228/232; 228/180.1; 219/390; 219/497
[58] Field of Search .......... 228/46, 232, 240, 180.1, 228/180.2, 102; 219/388, 360, 390, 497; 34/225, 223

[56] References Cited

U.S. PATENT DOCUMENTS

| | | | |
|---|---|---|---|
| 1,949,716 | 3/1934 | Harsch | 34/223 |
| 4,565,917 | 1/1986 | Furtek | 219/390 |
| 4,771,921 | 9/1988 | Bahr et al. | 228/232 |
| 4,909,430 | 3/1990 | Yokota | 228/240 |
| 4,938,410 | 7/1990 | Kondo | 228/180.1 |
| 4,972,988 | 11/1990 | Ohdate | 228/232 |
| 5,069,380 | 12/1991 | Deambrosio | 219/388 |

FOREIGN PATENT DOCUMENTS

| | | | |
|---|---|---|---|
| 1-205594 | 8/1989 | Japan | 228/180.1 |
| 2-396 | 1/1990 | Japan | 228/180.1 |

OTHER PUBLICATIONS

M. Roffey—Sep. 1990—Atmosphere Management in a Surface Mount Reflow Furnace—SMTCON West.
J. Hwang—May 1990—pp. 64–65—Soldering With Controlled Atmospheres—Circuits Manufacturing.
R. Trovato—Apr. 1990—pp. 66–67—Soldering Without Cleaning—Circuits Manufacturing.
J. Murray—Apr. 1990—pp. 68–69—No Clean Reflow Circuits Manufacturing.
M. Martel—Jun. 1989—pp. 33–41—New Wrinkles in Reflow—Circuits Manufacturing.
M. Martel—Feb. 1989—pp. 27–40—Forced Convection: The Dark Horse—Circuits Manufacturing.
N. Cox—Sep. 1989—pp. 24–27—Convection in the IR Furnace: It's Not Just For Panels—Circuits Manufacturing.
D. Brammer—1989—pp. 169–171—Fundamentals and Process Applications of Zoned Convection Reflow—EXPO SMT International '89 Technical Proceedings.
S. Kasturi—Jun. 1990—pp. 1015–1024—Forced Convection: Proceedings, NEPCON East.
A. Arslancan—Apr. 1990—pp. 301–308—IR Solder Reflow in Controlled Atmosphere of Air and Nitrogen—SMTCON Technical Proceeding.
D. Flattery—pp. 13–19—Selecting and Controlling Process Parameters for Successful Infrared SMT Reflow—Surface Mount Today.
B. Chan—Sep. 1989—pp. 188–198—The Evaluation of Various Infra-Red Reflow Machines for Use with Molded Circuit Boards—Proceedings, IEPS.
S. Avramescu—Nov. 1989—pp. 28–32—The Evolution in Reflow Soldering Systems—Circuits Manufacturing.
P. Fodor, et al.—pp. 64–66—Cover Gas Soldering Leaves Nothing to Clean Off PCB Assembly—Electronic Packaging & Production.

*Primary Examiner*—Kurt C. Rowan
*Assistant Examiner*—Jeanne M. Elpel
*Attorney, Agent, or Firm*—Thomas E. Schatzel

[57] ABSTRACT

A reflow furnace in which the rate at which the temperature of the parts being processed can change can be varied throughout the furnace in order to provide a high initial rise rate, a period of low or no rise, and a very fast rise to a temperature above the melting point of solder followed by a fast drop to a temperature below the melting point of the solder. The entire operation is performed in an atmosphere of air, inert gas, active gas, or combustible gas. In a stabilization zone and a reflow zone, the primary heating mode is forced, controlled convection that is perpendicular to surface of an assembly to be soldered.

6 Claims, 4 Drawing Sheets

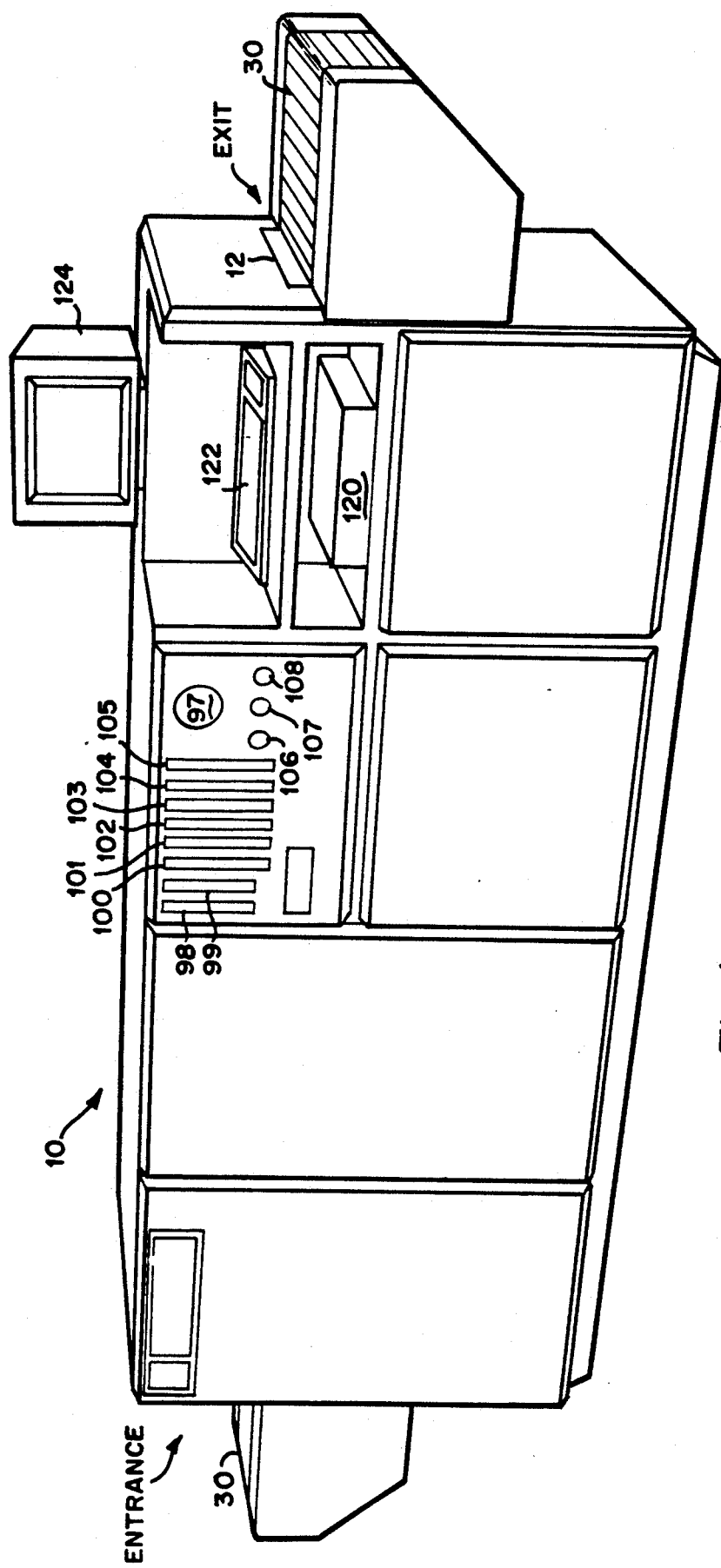
Fig._1

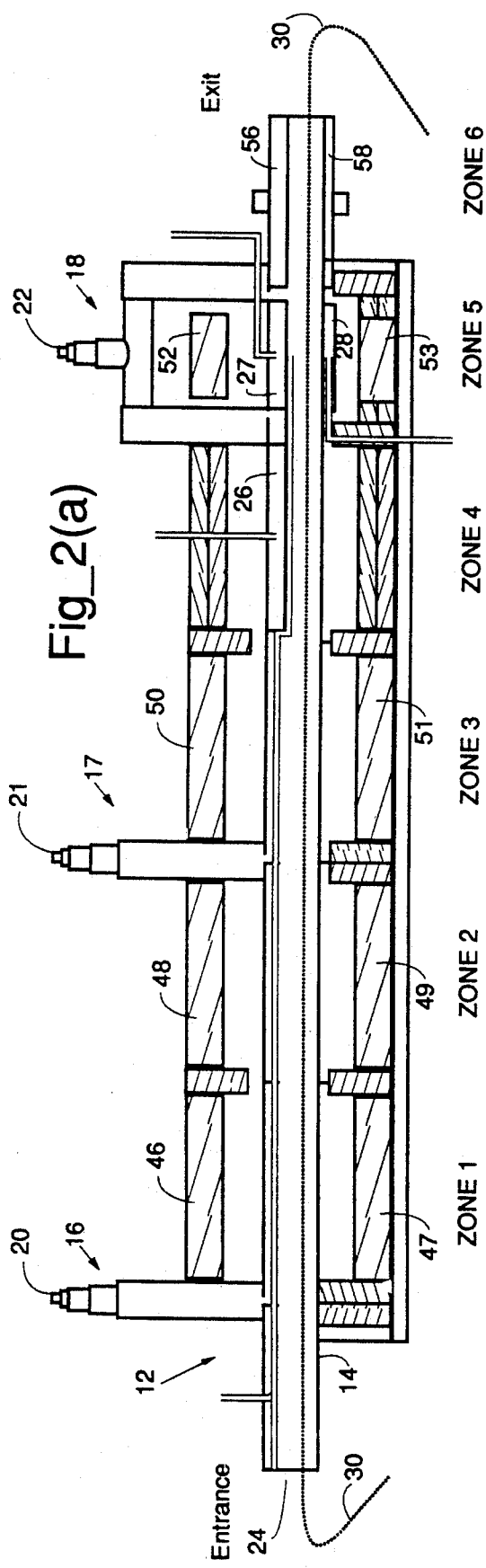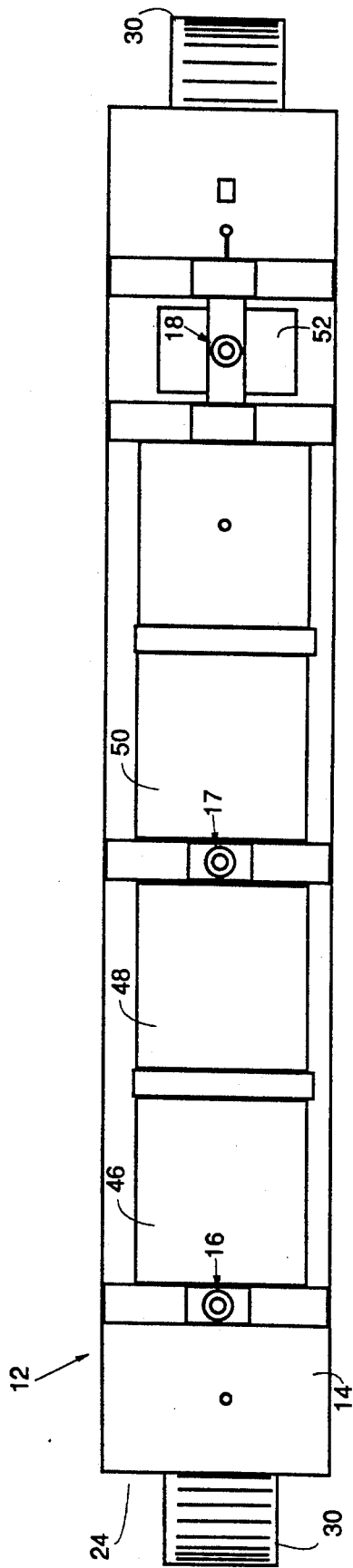

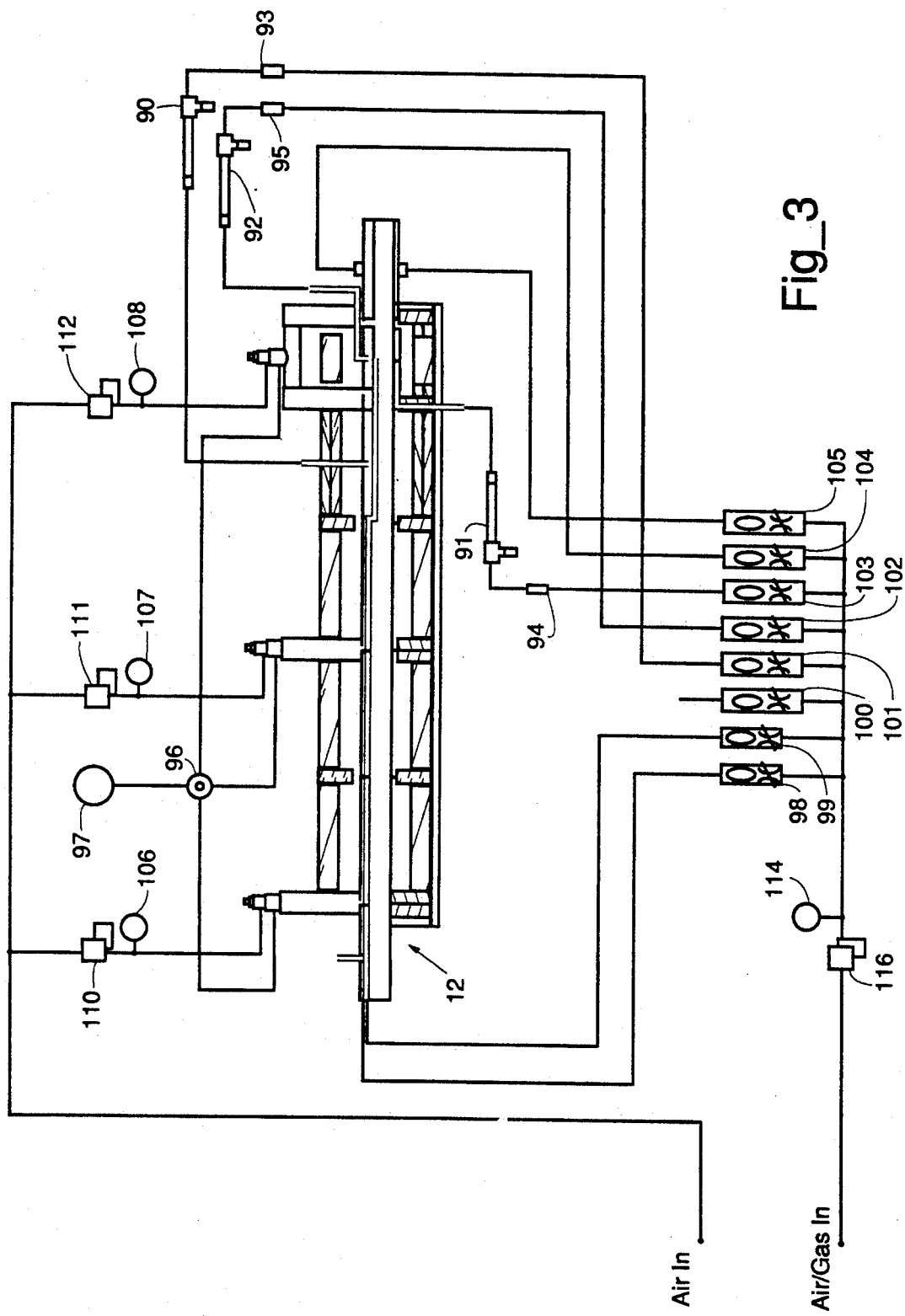
Fig_3

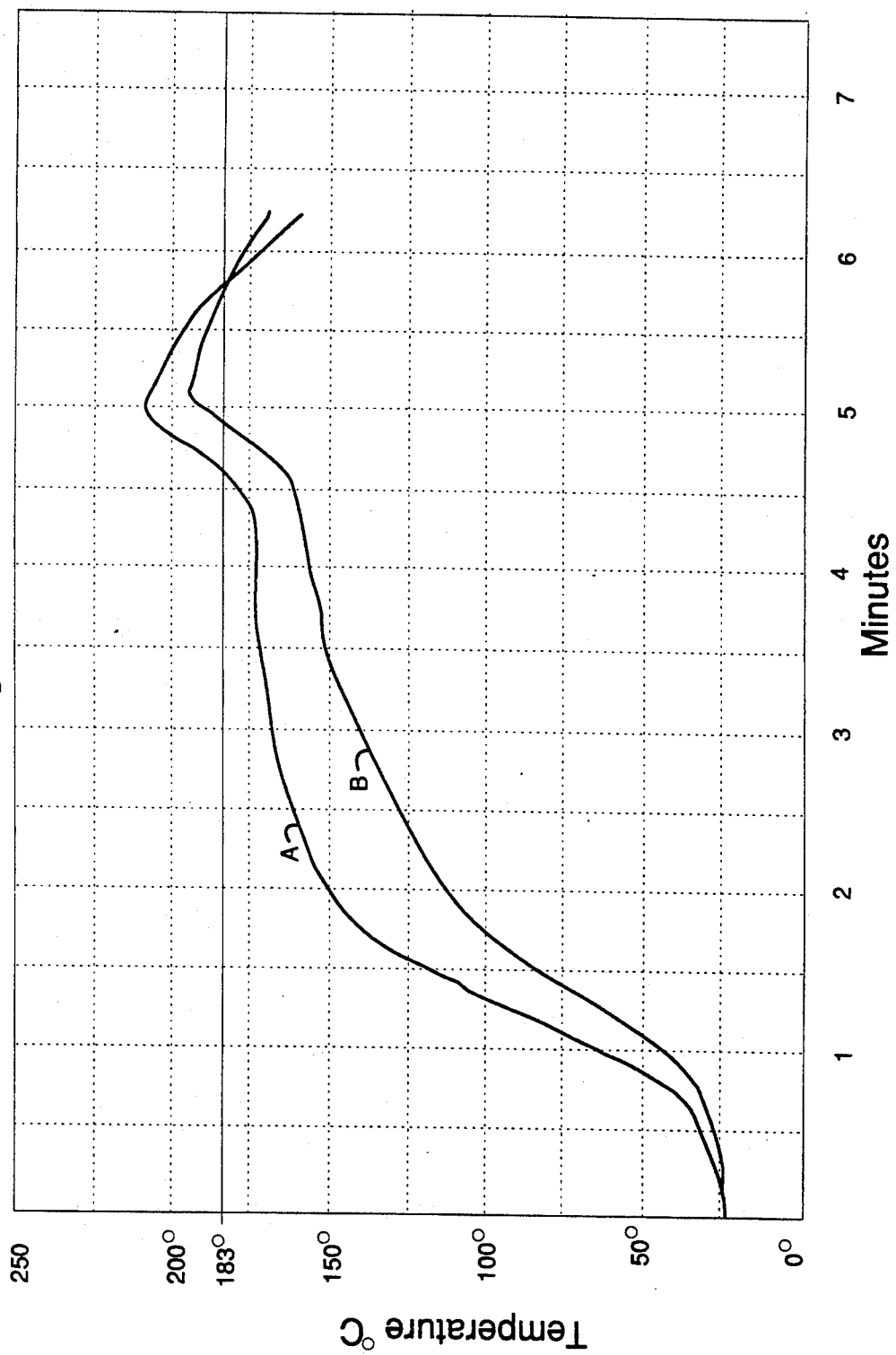
Fig_4

METHOD OF SOLDERING IN A CONTROLLED-CONVECTION SURFACE-MOUNT REFLOW FURNACE

BACKGROUND OF THE INVENTION

1. Field of the Invention

The invention relates generally to soldering equipment and more specifically to high volume production equipment capable of reflow soldering of printed circuit boards incorporating surface mount technology.

2. Description of the Prior Art

Temperature stability, repeatability, and uniformity in results for reflow soldering of both lightly and heavily loaded surface mount device (SMD) printed circuit boards are becoming increasingly more important. (Roffey, et al., "Atmosphere Management in a Surface Mount Reflow Furnace," *Proceedings of SMTCON West.* Sept. 1990.) A dual search for better quality solder joints and environmentally safe use of gases and chemicals has lead to the development of special atmospheres for use in reflow furnaces. (See, Hwang, J., "Soldering With Controlled Atmospheres," *Circuits Manufacturing*, May 1990, pp.64–65 [discussion of dry air, nitrogen, hydrogen, nitrogen/hydrogen blends, dissociated methanol/nitrogen blends, dissociated ammonia, exothermic gas, and nitrogen/dopants reflow atmospheres].) Post-solder CFC cleaning can be eliminated or reduced by the use of no-clean reflow processes that combine special solder creams, reflow ovens, and atmospheres. (See, Murray, J., "No-Clean Reflow," *Circuits Manufacturing*, April 1990, pp.68–69; and see, Trovato, R., "Soldering Without Cleaning," *Circuits Manufacturing.* April 1990, pp.66–67.)

The successful implementation of SMD technology depends on first-time product yields that are as good or better than conventional through-hole techniques. (Flattery, D. K., "Selecting and Controlling Process Parameters for Successful Infrared SMT Reflow," *PCNetwork*, September 1988, pp.13–19.) An increased joint count from increased component densities makes first-time yields highly dependent on improvements in solder defect rates. To obtain low solder defect rates requires the selection and control of reflow parameters. The reflow process is basically a function of the time an assembly is in a reflow atmosphere and the temperature of the atmosphere. Differences in time and temperature exist for various atmosphere gases that are present. For example, Flattery asserts that to eliminate board and flux damage the temperature limit for air is 230° C., and for nitrogen it is 260° C. These temperature limits can be difficult to maintain at the corners of a board while attempting to raise the center of the board to minimum temperatures needed to reflow solder (205° to 210° C). Early infrared (IR) reflow furnaces had been converted from IR fusing machines with little success. SMT assemblies have characteristics that resist quick and uniform heating, in contrast to bare circuit boards. Heat transfer by convection, conduction, and radiation is a function of the surface area of an object. And although radiation can deliver energy directly to the interior of an object, the surface always absorbs more than anywhere else. It is inevitable that some temperature difference will exist during reflow between the various parts of an assembly, based on their mass to surface area, according to Flattery.

As mentioned above, the environment in which solder reflow takes place is an important parameter of the whole process. The atmosphere must be controlled to achieve complete process control. (Arslancan, A. N., IR Solder Reflow in Controlled Atmosphere of Air and Nitrogen," *SMTCON Technical Proceedings*, April 1990, pp.301–308.) The benefits of controlled atmosphere soldering comprise positive exhaust of process effluents, isolation of the process atmosphere from the variability of the room environment, and process reliability and repeatability. Additional benefits are realized by using an inert atmosphere of nitrogen. Oxidation of the board material, flux, solder paste, and metal surfaces is eliminated; meaning improved solder wetting and bonding, solder joint appearance, widened process window, and ease in residue cleaning. In the SMD technology (SMT) industry, air has been used in passive (natural convection) form and in compressed clean/dry (controlled convection) form. Air is readily and freely available, and therefore the least expensive gas to use. But air contains oxygen and other oxidizing agents, and the use of air requires fairly active fluxes to achieve good quality solder joints. Using nitrogen ($N_2$), instead of air, offers many benefits that culminate in increased overall yields. Regardless of the kind of reflow system used, $N_2$ atmospheres result in reductions of the defect rates, according to Arslancan.

IR reflow machines have been used in the past to solder molded circuit boards. (Chan, B. "The Evaluation of Various Infra-red Reflow Machines for use with Molded Circuit Boards," Proceedings, IEPS, September 1989, pp.188–198.) Molded circuit boards require precise temperature control because they are made from engineering thermoplastics instead of thermoset plastics. For successful soldering, it is necessary to have even temperatures across the assembly undergoing reflow. Otherwise, burning and warping of the substrate and/or components can occur.

Digital Equipment Corporation (DEC) used vapor-phase processing for about six years for mass reflow of SMT assemblies. (Kasturi, S., "Forced Convection: The Key to the Versatile Reflow Process," Proceedings, NEPCON East, June 1990, pp. 1015–1024.) DEC then transitioned to the IR process, which eliminated problems in tombstoning and thermal shock that are associated with the vapor-phase process. But then problems with the IR process, e.g., uneven and inefficient heat transfer, edge burning and long process times, led DEC to the convection reflow process. Efforts have been made by IR/convection manufacturers of reflow equipment to mix radiation and convection in ratios ranging from 30:70 to 10:90. In reflow applications, forced convection is favored because convective forces can be controlled to become the primary heat transfer mechanism, according to Kasturi. Such control can be achieved by regulating the volume of gas present in each of several zones, the temperature and velocity profiles of the gas, and its flow pattern. Kasturi uses heating elements not to heat a board directly, but to heat the gas that will subsequently carry heat to the board. As reported by Kasturi, DEC has demonstrated that a furnace using forced convection with proper control of the fluid flow has several advantages over an IR system. All of which translate to reduced furnace set-up time, increased process flexibility, and improved product quality.

Zone controlled, forced convection reflow soldering systems are regarded as embracing a viable technology for reflow soldering of all types of SMD product, especially large, dense multilayer surface mount assemblies. (Brammer, D., "Fundamentals and Process Applications of Zoned Convection Reflow," *EXPO SMT International '89 Technical Proceedings*, pp.169–171.) Recirculated, heated air, recirculated in sufficient volume but at low velocities, is a very efficient heat transfer method, as is reported by Brammer. A zoned convection reflow (ZCR) process uses recirculated heated air that is divided into individually-controlled zones. A ZCR furnace is similar to a zoned IR reflow furnace in many ways, except that individual zones do not use IR emitter panels or lamps. Instead, air orifices and air heater elements, panels, and baffles are used. Such a system heats about 95% by forced convection and 5% by IR. Brammer diagrams in FIG. 1 (Brammer, supra) a multiple-zone system consisting of eight or ten individual, independently-controlled zones of top and bottom heat (four or five above the conveyor belt and four or five below). Assemblies are carried by the conveyor belt into a first heating zone called the pre-heat zone. The pre-heat zone ramps the temperature up from room temperature to 100° to 125° C., to minimize thermal shock. Preheating drives off flux solvents and moisture, and it activates the flux. Following passage through a transition zone, the assembly travels through three or four zones of top and bottom heat, each at different temperatures depending on the required furnace profile. A slight vacuum of the exhaust in the transition zone draws byproducts away from the assembly, thus the assembly constantly encounters fresh, heated air. Reflow of the solder occurs in the last zone, therefore the solder is liquid for only a few seconds. Cooling of the assembly is accomplished in a last, forced cooling zone that has been incorporated into an off-load area. (See also, Martel, M. L., "Forced Convection: The Dark Horse," *Circuits Manufacturing*, February 1989, pp.27–40 [describes Heller 1148R and SPT 770 convection reflow soldering systems and surveys the then-current state-of-the-art]; and see, Martel, M. L., "New Wrinkles in Reflow," *Circuits Manufacturing*, June 1989, pp.33–41 [survey of various new developments in convection reflow techniques].)

A suggested optimal temperature profile for preheat, dry, reflow, and cooling phases is diagrammed by Cox. (Cox, N. R., "Convection in the IR Furnace: It's Not Just for Panels," *Circuits Manufacturing*, September 1989, pp.24–27 [FIG. 2].) Such control in a ZCR system is implemented by using a rapid-response thermocouple, e.g., as in FIG. 1, supra. The key objective of a reflow system is to control the time/temperature profile accurately and consistently, and to accomplish reflow soldering in as brief a period as is possible.

The addition of forced convection to reflow techniques has significantly reduced temperature distribution effects associated with both lamp and panel IR systems. The work of Brammer and Kasturi demonstrate that using convection as the only method of heating results in even better temperature distributions, and low component temperatures. An "atmosphere tight" system should be capable of operating with a maximum oxygen content of less than five parts per million (ppm) above that of the source gas. Nitrogen has many benefits as a cover gas and the use of toxic gases in some prior art systems may prove to be flammable and/or harmful to the environment.

SUMMARY OF THE PRESENT INVENTION

It is therefore an object of the present invention to produce a reflow furnace that has reduced furnace set-up time, improved process flexibility, and improved product quality.

Briefly, a reflow furnace of the present invention comprises a substantially 100% convection system having a clean dry air, nitrogen, or other cover gas, a convection perpendicular to a conveyor, and a microprocessor control having recipe storage capability. The reflow furnace is one in which the rate at which the temperature change of the parts being processed can be varied throughout the furnace in order to provide a high initial rise rate, a period of low or no rise, and a very fast rise to a temperature above the melting point of solder followed by a fast drop to a temperature below the melting point of the solder. Accurate temperature control is achieved by means of Proportional plus Integral plus Differential (PID) control. This is a technique which provides for extremely responsive control by evaluating feedback from the process in several ways in combination. In conventional Proportional control, a system's control response is larger or smaller depending on the magnitude of the difference between some actual process parameter and the desired nominal value. Integral control provides the ability to increase the system's control response when an actual process parameter is close to nominal but for a long period of time. That is, a close to nominal value will not generate a large response from a proportional control system by itself. Differential control provides the ability to detect the rate of change of various process parameters and thereby to initiate a large response to a quick, but small, change. The combination of these three control techniques is referred to as PID. The entire operation can alternatively be performed in an atmosphere of air, inert gas, active gas, or combustible gas with the addition of simple safety systems well known to the industry. In a stabilization zone and a reflow zone, the primary heating mode is forced, controlled convection that is injected perpendicular to surface of an assembly to be soldered.

An advantage of the present invention is that the temperature distribution in an assembly subjected to reflow processes is reduced.

Another advantage of the present invention is that environmentally safe cover gases are used.

Another advantage of the present invention is that all gas used in the process is exhausted quickly, thus preventing the redeposition of fluxes in the furnace.

Another advantage of the present invention is that all sources of convection are under total control, thus optimizing solder joint quality.

Another advantage of the present invention is that shadowing and temperature gradients are reduced by perpendicular convection.

Another advantage of the present invention is that processes can be rapidly changed from one cover gas to a different cover gas.

Another advantage of the present invention is that the response time to "turn on" and profile change is similar to existing reflow furnaces.

These and other objects and advantages of the present invention will no doubt become obvious to those of ordinary skill in the art after having read the following detailed description of the preferred embodiments which are illustrated in the various drawing figures.

IN THE DRAWINGS

FIG. 1 is a three dimensional view of a reflow furnace of the present invention;

FIGS. 2(a) and 2(b) detail the muffle within the reflow furnace of FIG. 1. FIG. 2(b) is a top elevational view of the muffle and FIG. 2(a) is a longitudinal cross section of the muffle;

FIG. 3 is an atmosphere plumbing schematic of the reflow furnace of FIG. 1 and shows the connections to the muffle of FIG. 2; and FIG. 4 is a temperature versus time plot of the heat rise in a typical board/assembly passed through the furnace of FIG. 1.

DETAILED DESCRIPTION OF THE PREFERRED EMBODIMENTS

FIGS. 1 and 2 illustrate a controlled-convection furnace of the present invention, referred to by the general reference numeral 10, having zones one through six. Furnace 10 comprises a one-piece, welded, low-thermal mass metal muffle 12 coated on the outside with a high emisivity material 14 to increase responsiveness. Integral to muffle 12 are three exhaust ports 16-18 equipped with venturi extractors 20-22. The first exhaust port 16 is located between an entrance 24 and the start of zone one, the second exhaust port 17 is positioned between zones two and three, and the third exhaust port 18 is arranged to remove reflow atmosphere from each end of a reflow zone, zone five. All three exhaust ports 16-18 are separately adjusted by individual pressure regulators (detailed below) and are monitored from zero to 2.00 inches by a magnehelic pressure gauges (see discussion for FIG. 3, below). Muffle 12 further comprises three heated gas plenums 26-28, Plenum 26 is above conveyor belt 30 in zone four. Plenums 27 and 28 are above and below belt 30, respectively, in the reflow section, zone five. Each of plenums 26-28 is equipped with its own separately controlled in-line gas heater. The flow rate of gas to each plenum 26-28 is controlled by a flowmeter. Inside muffle 12, in zones one through three, there are right and left gas distribution tubes which are connected to flowmeters (see below). Sample ports are preferably provided in zones one through five within muffle 12 for analysis of the reflow atmosphere. Outside of muffle 12, and in close proximity to it, are low thermal mass, insulated panel heaters 46-53. In zones one through three, the top and bottom heaters 46-51 are controlled in tandem, while heaters 52-53 in zone five are controlled individually. At the end of muffle 12, in zone six, are top and bottom quench plenums 56 and 58, respectively. Plenums 56 and 58 are individually controlled by flowmeters. An inert gas curtain (not shown) is preferably provided at entrance 24.

FIG. 3 diagrams the plumbing of furnace 10, which comprises three gas heaters 90-92, three acrylic flow switches 93-95, a five-way brass ball valve 96, a 0-2.00" H$_2$O magnehelic pressure gauge 97, two 0-120 SCFH flowmeters 98-99, six 0.5-6 SCFM flowmeters 100-105, three 0-60 PSI pressure gauges 106-108, three pressure regulators 110-112, a 0-100 PSI pressure gage 114, and a pressure regulator 116. Gas heaters 90-92 are preferably 2500 watt, 240 volt. Air supplied to the system should be clean and dry and be passed through at most a ten micron filter. The air heaters 90-92 are mounted as close to muffle 12 as possible to minimize heat loss from downstream tubing. Flow switches 93-95 should be mounted vertically where the flow is upward, with wires pointing upward for normally open contacts. Flowmeter 98 supplies zone one and two air rakes, and flowmeter 99 supplies zone three air rake. Flowmeter 100 is spare. Flowmeter 101 supplies zone four plenum through flow switch 93 and heater 90, flowmeter 102 supplies the top reflow plenum through flow switch 95 and heater 92, and flowmeter 103 supplies the bottom reflow plenum through flow switch 94 and heater 91. Flowmeters 104 and 105 supply the top and bottom quench plenums, respectively. Gas temperature is controlled by thermocouples in the gas flow immediately downstream of gas heaters 90-92 that sense gas temperature and relay the information to a microcomputer 120. Panel heaters 52-53 are controlled by thermocouples in contact with the outside of muffle 12. Panel heaters 46-51 are controlled via microcomputer 120 by using a combination of thermocouples suspended inside muffle 12 and thermocouples in contact with the outside of muffle 12. This combination produces optimum response of furnace 10 to changing load conditions. All the zones of furnace 10 are equipped with independent over-temperature controls. The microcomputer has a keyboard 122 and a monitor 124, and controls and coordinates the overall operation of furnace 10. Metal muffle 12 may be optionally equipped with burn-off stacks (not shown) to permit the safe use of toxic or combustible gas atmospheres.

A board/assembly to be reflow soldered is introduced to furnace 10 at entrance 24. Zones one and two provide the initial temperature ramp up of the board/assembly. These two zones are similar to a conventional muffle type convection furnace, but with at least one exception. The gas distribution tubes inject gas into the interior of muffle 12 such that a turbulent flow is created which increases the heat transfer and is injected such that temperature uniformity is maintained across the chamber. Zone three continues the temperature ramp up, but at a slower rate. A similar gas distribution system is used. Zone four has no heating elements, all the heat that is supplied is furnished by a hot gas blanket within the zone. Gas temperature is controlled in zone four to be just under the melting point of solder, therefore all parts of the board, including the various sized components, tend to stabilize at that temperature. Zone five, the reflow zone, has heating elements outside muffle 12 and hot gas plenums above and below the belt. Each of these heat sources is separately controlled to give maximum versatility in zone five. In order to eliminate any bleed-over of the reflow gasses from the reflow zone to adjacent zones, all reflow gas is exhausted from each end of the reflow zone (zone five). Zone six provides rapid cooling through cold gas plenums in the top and bottom of the muffle 12. Further cooling is obtained through a series of updraft fans placed just after the exit of muffle 12. Adjustable gas dispersion tubes are preferably added to one or more zones to control cross chamber temperature uniformity.

FIG. 4 illustrates a typical heat rise profile for board assemblies that were obtained by the inventors during tests of a prototype of reflow furnace 10. A first test "A" and a second test "B" are shown. An assembly will enter zones one and two within the first two minutes and experience a rapid rise in temperature. (All times are exemplary for this one instance.) A less rapid rise in temperature occurs in zone three between two and three minutes. Between three and four minutes zone four will stabilize temperatures just under the melting-point of solder, shown in FIG. 4 as 183° C. In zone five heaters 52 and 53 and gas heaters 90 and 92 bring the assembly temperature to a brief peak at five minutes. Thereafter a rapid cool down occurs in zone six.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A method of reflow soldering, comprising the steps of:

providing a muffle, having a plurality of processing zones, for containment of the processing atmosphere, and a conveyor means for transporting at least one assembly through said muffle;

measuring the temperature of gas inside at least one processing zone of said muffle;

measuring the temperature of a portion of the outer surface of said muffle, said outer surface portion corresponding to the region of said processing zone;

combining said temperature measurements in order to achieve temperature control that does not overreact to load-condition-dependent gas temperature fluctuations;

measuring the volume of gas introduced into said muffle;

adjusting the volume of gas introduced into said muffle;

measuring the velocity of gas introduced into said muffle;

adjusting the velocity of gas introduced into said muffle;

ramping up the temperature of an assembly to be soldered in at least one preheating processing zone of a muffle by substantially 100% convection heating using gas distribution tubes to perpendicularly inject a turbulent gas flow into the muffle such that convective heat transfer to said assembly is accomplished thereby;

raising the temperature of said assembly in at least one continuation processing zone that follows said preheating processing zones within said muffle at a rate of heat rise less than in said preheating processing zones;

heating said assembly with a hot gas blanket in at least one stabilization processing zone following said continuation processing zone to a temperature controlled to be just under the melting point of solder;

reflowing solder on said assembly in a reflow processing zone that follows the stabilization processing zone, said reflow processing zone having a plurality of heating elements, said reflow processing zone heating elements disposed outside said muffle and hot gas plenums above and below the line of travel of said assembly, each of said heat sources being separately controlled;

exhausting reflow gases from each end of the reflow processing zone such that the bleed over of reflow gases into other processing zones is reduced; and cooling said assembly in a quenching processing zone such that rapid cooling of said assembly occurs, said quenching processing zone having a cold gas plenums above and below the line of travel of said assembly.

2. The method of claim 1, wherein:

the cooling of said assembly comprises passing said assembly through an updraft created by a bank of fans.

3. The method of claim 1, wherein said step of exhausting gases is accomplished by means of a plurality of exhaust ports, each said exhaust port having an individually adjustable pressure regulator.

4. The method of claim 1, further comprising the step of:

filtering said gases, prior to entry of said gases into said processing zones.

5. The method of claim 1, further comprising the steps of:

sampling said reflow gases through at least one sample port; and analyzing said sampled reflow gases to obtain information regarding the reflow atmosphere.

6. The method of claim 1, further comprising the steps of:

providing an inert gas curtain at the entrance to said preheating processing zone;

providing an assembly conveying means for transporting said assemblies through said processing zones; and conveying said assemblies from one of said processing zones to another of said processing zones in a serial fashion.

* * * * *